US009938623B1

(12) United States Patent
Schaedler et al.

(10) Patent No.: US 9,938,623 B1
(45) Date of Patent: Apr. 10, 2018

(54) ULTRA-LIGHT MICRO-LATTICES AND A METHOD FOR FORMING THE SAME (71) Applicant: HRL Laboratories, LLC, Malibu, CA (US)

(72) Inventors: Tobias A. Schaedler, Oak Park, CA (US); Alan J. Jacobsen, Woodland Hills, CA (US); William Carter, Calabasas, CA (US); Christopher Roper, Oak Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 15/201,344

(22) Filed: Jul. 1, 2016

Related U.S. Application Data (62) Division of application No. 13/584,108, filed on Aug. 13, 2012, now Pat. No. 9,415,562.

(60) Provisional application No. 61/524,714, filed on Aug. 17, 2011.

(51) Int. Cl.
C23C 18/16 (2006.01)
C23C 18/32 (2006.01)
G03F 7/00 (2006.01)

(52) U.S. Cl.
CPC ...... *C23C 18/1648* (2013.01); *C23C 18/1641* (2013.01); *C23C 18/1644* (2013.01); *C23C 18/1657* (2013.01); *C23C 18/32* (2013.01); *G03F 7/0015* (2013.01)

(58) Field of Classification Search
CPC ............ C23C 18/1641; C23C 18/1644; C23C 18/1689; C23C 14/0005; C23C 14/5873; C23C 16/01; C23C 18/1648; C23C 18/1657; C23C 18/32; B05D 1/18; B05D 1/60; B32B 3/12; G03F 7/0015
See application file for complete search history.

(56) References Cited

U.S. PATENT DOCUMENTS

| 3,694,325 A | 9/1972 | Greene et al. |
| 4,053,371 A | 10/1977 | Towsley |
| 4,390,599 A | 6/1983 | Broyles |
| 4,752,498 A * | 6/1988 | Fudim .................... B01J 19/121 118/620 |
| 4,882,232 A * | 11/1989 | Bugnet ................. H01M 4/747 204/192.14 |

(Continued)

FOREIGN PATENT DOCUMENTS

WO WO 02098644 A2 12/2002

OTHER PUBLICATIONS

Guinness Book of World Records, Least Dense Solid, 2003. http://www.guinnessworldrecords.com/Search/Details/Least-dense-solid/47186.htm.

(Continued)

*Primary Examiner* — Jason L Vaughan
(74) *Attorney, Agent, or Firm* — Tope-McKay & Associates (57) ABSTRACT The present invention relates to a micro-lattice and, more particularly, to an ultra-light micro-lattice and a method for forming the same. The micro-lattice is a cellular material formed of interconnected hollow tubes. The cellular material has a relative density in a range of 0.001% to 0.3%, and a density of 0.9 mg/cc has been demonstrated. The cellular material also has the ability to recover from a deformation exceeding 50% strain.

11 Claims, 11 Drawing Sheets

(56) References Cited

U.S. PATENT DOCUMENTS

| | | | | |
|---|---|---|---|---|
| 5,109,589 | A * | 5/1992 | Cramer | C25D 1/10 29/424 |
| 6,379,962 | B1 * | 4/2002 | Holy | A61L 27/18 424/423 |
| 6,472,210 | B1 * | 10/2002 | Holy | A61L 27/18 424/423 |
| 6,503,564 | B1 * | 1/2003 | Fleming | B05D 1/60 427/255.6 |
| 7,022,522 | B2 * | 4/2006 | Guan | A61L 27/18 424/423 |
| 7,129,183 | B2 | 10/2006 | Mori et al. | |
| 7,382,959 | B1 * | 6/2008 | Jacobsen | B82Y 20/00 385/129 |
| 7,421,159 | B2 * | 9/2008 | Yang | G02B 6/32 385/137 |
| 7,531,120 | B2 * | 5/2009 | Van Rijn | A61L 27/50 264/299 |
| 7,653,276 | B1 * | 1/2010 | Gross | F28D 20/023 385/46 |
| 7,687,132 | B1 * | 3/2010 | Gross | B22F 1/0007 385/129 |
| 7,704,644 | B2 * | 4/2010 | Schneider | B82Y 20/00 359/3 |
| 7,736,724 | B1 * | 6/2010 | Johnson | H01M 10/0436 427/115 |
| 2004/0123980 | A1 | 7/2004 | Queheillalt et al. | |
| 2005/0115186 | A1 * | 6/2005 | Jensen | A45F 3/04 52/633 |
| 2005/0255289 | A1 * | 11/2005 | Wadley | B22F 7/002 428/116 |
| 2006/0084942 | A1 * | 4/2006 | Kim | A61K 9/0021 604/890.1 |

OTHER PUBLICATIONS

J.Zou, J. Liu, A. S. Karakoti, A. Kumar, D. Joung, Q. Li, S. I. Khondaker, S. Seal, L. Zhai, "Ultralight Multiwalled Carbon Nanotube Aerogel," ACS Nano 4 7293-7302 (2010).
A. Verdooren, H. M. Chan,w J. L. Grenestedt, M. P. Harmer, and H. S. Caram, "Fabrication of Low-Density Ferrous Metallic Foams by Reduction of Chemically Bonded Ceramic Foams," J. Am. Ceram. Soc. 89 3101-3106 (2006).
B. C. Tappan, M. H. Huynh, M. A. Hiskey, D. E. Chavez, E. P. Luther, J. T. Mang, S. F. Son, "Ultralow-Density Nanostructured Metal Foams: Combustion Synthesis, Morphology, and Composition," J. Am. Chem. Soc. 128 6589-6594 (2006).
BASF Corp., Materials Safety Data Sheet for Basotect V3012 (2007) http://www.basf.co.kr/02_products/01_thermoplastics/spe/document/MSDS-Basotect%20V3012.pdf.
Hexcel Corp., HexWeb™ Honeycomb Attributes and Properties, (Datasheet, 1999). http://www.hexcel.com/Resources/DataSheets/Brochure-Data-Sheets/Honeycomb_Attributes_and_Properties.pdf.
V. S. Deshpande, M. F. Ashby, N. A. Fleck, "Foam topology bending versus stretching dominated architectures," Acta Materialia. 49 1035-1040 (2001).
R. S. Lakes. "Materials with structural hierarchy." Nature 361 511-515 (1993).
A.J. Jacobsen, W.B. Carter, S. Nutt, "Compression behavior of micro-scale truss structures formed from self-propagating polymer waveguides." Acta Materialia 55, pp. 6724-6733 (2007).
A.J. Jacobsen, W.B. Carter, S. Nutt, "Micro-scale Truss Structures formed from Self-Propagating Photopolymer Waveguides." Advanced Materials 19 3892-3896 (2007).
A. J. Jacobsen, William Barvosa-Carter, Steven Nutt, "Micro-scale truss structures with three-fold symmetry formed from self-propagating polymer waveguides" Acta Materialia (2008), vol. 56, No. 11, Publisher: Elsevier, pp. 2540-2548.
A.J. Jacobsen, W.B. Carter, S. Nutt, "Shear behavior of polymer micro-scale truss structures formed from self-propagating polymer waveguides." Acta Materialia 56 2540-2548 (2008).
S.H. Park, D. N. Lee, "A study on the microstructure and phase transformation of electroless nickel deposits." Journal of Materials Science 23 1643-1654 (1988).
J. Lian, L. Valdevit, T. A. Schaedler, A.J. Jacobsen, W. Barvosa-Carter, J. R. Greer, "Catastrophic vs. gradual collapse of thin-walled nanocrystalline Ni cylinders as building blocks of micro-lattice structures," Nano Letters 11 p. 4118 (2011).
S. Y. Chang, Y. S. Lee, H. L. Hsiao, T. K. Chang, "Mechanical properties and deformation behavior of amorphous nickel-phosphorous films measured by nanoindentation test." Metall Mater Trans A 37A 2939-2945 (2006).
L. G. Brazier, "On the Flexure of Thin Cylindrical Shells and Other "Thin" Sections," Proceedings of the Royal Society of London. Series A, 116, No. 773 (1927), pp. 104-114.
N.J. Mills "Finite Element Models for the viscoelasticity of open-cell polyurethane foam." Cellular Polymers 5 293-316 (2006).
A. Cao, P. L. Dickrell, W. G. Sawyer, M. N. Ghasemi-Nejhad, P. M. Ajayan, "Super-Compressible Foamlike Carbon Nanotube Films." Science 310 1307-1310 (2005).
J. R. Trelewicz, C. A. Schuh, "The Hall-Petch breakdown in nanocrystalline metals: A crossover to glass-like deformation." Acta Materialia 55 5948-5958 (2007).
G. F. Smits, "Effect of Cellsize Reduction on Polyurethane Foam Physical Properties Reduction." Journal of Building Physics 17 309-329 (1994).
Mecklenburg et al., Aerographite: "Ultra Lightweight, Flexible Nanowall, Carbon Microtube Material with Outstanding Mechanical Performance," Advanced Materials (2012).
Schaedler, T.A., Jacobsen, A.J., Torrents, A., Sorensen, A.E., Lian, J., Greer, J.R., Valdevit, L., Carter, W.B., (Nov. 2011), "Ultralight Metallic Microlattices." Science 334, 962-965.
"Synthesis of open-cell metal foams by templated directed vapor deposition", Journal of Materials Research 16 (4): 1028-1036.
L. J. Gibson, M. F. Ashby, Cellular Solids: Structure and Properties (Cambridge Univ. Press, Cambridge, UK, 1997), Chapter 5.
W. C. Young, R. G. Budynas, Roark's Formulas for Stress and Strain (McGraw-Hill, New York ed. 7 2002) p. 735.
J. E. Butler, A. V. Sumant, "The CVD of Nanodiamond Materials." Chem. Vap. Deposition 14 145-160 (2008).
M. F. Ashby, A. G. Evans, N. A. Fleck, L. J. Gibson, J. W. Hutchinson, H. N. G. Wadley, "Metal Foams: A Design Guide" (Butterworth-Heinemann, Burlington, MA, 2000) pp. 251, chapter 2 and 4.
Evans, et al., "Concepts for enhanced energy absorption using hollow micro-lattices," International Journal of Impact Engineering, vol. 37, No. 9, Apr. 2010 (Online published), pp. 947-959.
Bouwhuis, et al., "Mechanical properties of hybrid nanocrystalline metal foams," ACTA Materialia, vol. 57, No. 14, Jun. 2009, pp. 4046-4053.
Jacobsen, et al., "Interconnected self-propagating photopolymer waveguides: an alternative to stereolithography for rapid formation of lattice-based open-cellular materials," Twenty First Annual International Solid Freeform Fabracation Symposium—An Additive Manufacturing Conference, 2010 pp. 846-853.
PCT International Search Report and the Written Opinion of the International Searching Authority for PCT/US2012/050936, dated Feb. 18, 2013.
PCT Preliminary Report on Patentability and the Written Opinion of the International Searching Authority for PCT/US2012/050936, dated Feb. 17, 2014.
First Office Action for Chinese Patent Application No. 201280040063.9, filed pursuant to International Patent Application No. PCT/US2012/050936, dated May 6, 2015.
English translation of the First Office Action for Chinese Patent Application No. 201280040063.9, filed pursuant to International Patent Application No. PCT/US2012/050936, dated Sep. 7, 2015.
Response to the First Office Action for Chinese Patent Application No. 201280040063.9, filed pursuant to International Patent Application No. PCT/US2012/050936, dated Oct. 20, 2015.
Second Office Action for Chinese Patent Application No. 201280040063.9, filed pursuant to International Patent Application No. PCT/US2012/050936, dated Feb. 5, 2016.

(56) References Cited

OTHER PUBLICATIONS

English translation of the Second Office Action for Chinese Patent Application No. 201280040063.9, filed pursuant to International Patent Application No. PCT/US2012/050936, dated Feb. 26, 2016.
English translation of Pending Claims in the Second Office Action for Chinese Patent Application No. 201280040063.9, filed pursuant to International Patent Application No. PCT/US2012/050936, dated Feb. 26, 2016.
Office Action 1 for U.S. Appl. No. 13/584,108, dated Oct. 24, 2014.
Response to Office Action 1 for U.S. Appl. No. 13/584,108, dated Dec. 18, 2014.
Office Action 2 for U.S. Appl. No. 13/584,108, dated Feb. 12, 2015.
Response Office Action 2 for U.S. Appl. No. 13/584,108, dated May 12, 2015.
Office Action 3 for U.S. Appl. No. 13/584,108, dated Jul. 16, 2015.
Response to Office Action 3 for U.S. Appl. No. 13/584,108, dated Oct. 14, 2015.
Office Action 4 for U.S. Appl. No. 13/584,108, dated Nov. 12, 2015.
Response to Office Action 4 for U.S. Appl. No. 13/584,108, dated Mar. 14, 2016.
Notice of Allowance for U.S. Appl. No. 13/584,108, dated Apr. 14, 2016.
Communication under Rule 71(3) EPC (2004) for European Regional Phase Patent Application No. 12823315.2, filed pursuant to International Patent Application No. PCT/US2012/050936, dated Nov. 25, 2016.
Response to the Second Office Action for Chinese Patent Application No. 201280040063.9, filed pursuant to International Patent Application No. PCT/US2012/050936, dated Apr. 8, 2016.
Third Office Action for Chinese Patent Application No. 201280040063.9, filed pursuant to International Patent Application No. PCT/US2012/050936, dated Aug. 10, 2016.
Response to the Third Office Action for Chinese Patent Application No. 201280040063.9, filed pursuant to International Patent Application No. PCT/US2012/050936, dated Dec. 22, 2016.
Fourth Office Action for Chinese Patent Application No. 201280040063.9, filed pursuant to International Patent Application No. PCT/US2012/050936, dated Mar. 20, 2017.
Response to Fourth Office Action for Chinese Patent Application No. 201280040063.9, filed pursuant to International Patent Application No. PCT/US2012/050936, dated May 24, 2017.
Opinion accompanying the supplementary European search report for European Regional Phase Patent Application No. 12823315.2, filed pursuant to International Patent Application No. PCT/US2012/050936, dated Sep. 18, 2015.
A response to the Opinion accompanying the supplementary European search report for European Regional Phase Patent Application No. 12823315.2, filed pursuant to International Patent Application No. PCT/US2012/050936, dated Jan. 6, 2016, including clean and marked up copies of the claims.
Granted EPO patent No. EP 2 744 744 B1,Date of publication and mention of the grant of the patent: May 10, 2017.

\* cited by examiner

| Sample | Cell Length L (μm) | Average Diameter D (μm) | Strut Angle θ (°) | Wall thickness t (nm) | Density (mg/cm³) | Relative Density (%) | Compressive Stiffness (kPa) |
|---|---|---|---|---|---|---|---|
| A | 4000 | 500 | 60 | 100 | 0.9 | 0.01 | - |
| B | 4000 | 500 | 60 | 120 | 1.0 | 0.01 | 0.7 |
| C | 4000 | 500 | 60 | - | 1.7 | 0.02 | 9 |
| D | 1050 | 135 | 60 | 100 | 3.4 | 0.04 | - |
| E | 4000 | 500 | 60 | - | 4.5 | 0.06 | 78 |
| F | 4000 | 500 | 60 | 650 | 6.3 | 0.08 | 328 |
| G | 675 | 120 | 60 | 250 | 11.2 | 0.14 | 181 |
| H | 4662 | 500 | 60 | - | 11.3 | 0.14 | 473 |
| I | 817 | 170 | 50 | 500 | 14.1 | 0.18 | 624 |
| J | 1050 | 150 | 60 | 500 | 14.4 | 0.18 | 336 |
| K | 1050 | 140 | 60 | 550 | 16.2 | 0.20 | 706 |
| L | 1050 | 160 | 60 | 550 | 17.1 | 0.21 | 1300 |
| M | 1050 | 150 | 60 | 1400 | 43.1 | 0.54 | 9100 |
| N | 4000 | 500 | 60 | ~5000 | 55.0 | 0.69 | 6000 |

FIG. 6

ULTRA-LIGHT MICRO-LATTICES AND A METHOD FOR FORMING THE SAME

CROSS-REFERENCE TO RELATED APPLICATIONS

This is a Divisional Application of U.S. Non-Provisional application Ser. No. 13/584,108, filed on Aug. 13, 2012, entitled, "Ultra-Light Micro-Lattices and a Method for Forming the Same", which is a Non-Provisional Utility Patent Application of U.S. Provisional Application No. 61/524,714, filed on Aug. 17, 2011, entitled, "Architected Ultra-light Micro-lattices: Redefining the Limits of Low-Density Materials," the entirety of which are hereby incorporated by reference.

GOVERNMENT LICENSE RIGHTS

This invention was made with government support under U.S. Government Contract Number W91CRB-10-C-0305. The government has certain rights in the invention.

BACKGROUND OF THE INVENTION

(1) Field of Invention

The present invention relates to a cellular material and, more particularly, to an ultra-light micro-lattice and a method for forming the same.

(2) Description of Related Art

Low-density materials are often formed by introducing significant porosity into an architected constituent solid. The effective properties of these highly porous materials are defined both by their cellular architecture (the spatial configuration of voids and solid) and the properties of the solid constituent (e.g. stiffness, strength, etc.). Some materials that currently exist in the ultra-light regime below 10 mg/cc are traditional foams and aerogels. Previously, silica aero gel held the record for lowest density material at 1 mg/cc (See the List of Cited Literature References, Literature Reference No. 1). However, recent innovations have led to the development of aerographite, which is on record as the lowest density material at 0.2 mg/cc (See Literature Reference No. 24). Other ultra-light materials include carbon nanotube aero gel with a density of 4 mg/cc (See Literature Reference No. 2), metallic foams with densities as low as 10 mg/cc (See Literature Reference Nos. 3 and 4) and polymer foams reaching 8 mg/cc (See Literature Reference Nos. 5 and 6). Such ultra-light materials are highly desired for specific strength and stiffness, energy absorption, thermal insulation, damping, acoustic absorption, active cooling and energy storage, and provide excellent solutions for a variety of multifunctional applications (See Literature Reference No. 7). The existing ultra-low-density materials mentioned above have random cellular architectures, with mechanical performance dominated by bending of internal ligaments, resulting in specific properties far below those of the bulk constituent (See Literature Reference No. 7). The only exception in the ultra-light regime are honeycomb structures, which have a periodic architecture and excellent mechanical properties, but are highly anisotropic and reach their fabrication limit at ~10 mg/cc (See Literature Reference No. 8). To maximize the mechanical properties such as strength, stiffness, and energy absorption of a cellular material for a given constituent solid, cellular architectures must be formed that are ordered and mechanically efficient. Deshpande et al. have demonstrated that ligament bending can be suppressed in suitably designed ordered, truss-like cellular architectures, resulting in stretching dominated mechanical behavior, with a significant increase in effective elastic modulus and strength (See Literature Reference No. 9).

However, none of the currently available techniques result in a material with ultra-low densities (e.g., less than 0.1% relative density) and a lattice cellular architecture that can enable a material with the desired strength and the ability to achieve recoverable deformation. Thus, a continuing need exists for an ultra-light micro-lattice and a method for forming such a lattice that possesses an ultra-low relative density and also possesses the ability to achieve recoverable deformation.

SUMMARY OF INVENTION

The present invention relates to a micro-lattice and, more particularly, to an ultra-light micro-lattice and a method for forming the same. The micro-lattice is a cellular material formed of hollow tubes. The cellular material has an extremely low relative density, in a range of 0.001% to 0.3%. Further, the hollow tubes have a diameter such that the diameter is between 10 and 1000 microns. In another aspect, the hollow tubes are formed by tube walls having a wall thickness between 0.01 and 2 microns.

As noted herein, the cellular material is capable of dramatic recoverable deformations. For example, the cellular material is adapted to recover from deformations in a range of 2% to 90%.

In another aspect, the hollow tubes are formed of a metallic material or formed of a material selected from a group consisting of nickel, zinc, chrome, tin, copper, gold silver, platinum, rhodium, aluminum, a ceramic, including, diamond, diamond like carbon, alumina, zirconia, tin oxide, zinc oxide, silicon oxide, silicon carbide, silicon nitride, titanium nitride, tantalum nitride, tungsten nitride, a polymer including Parylene™, or any combination or alloy thereof. The invention includes any material that can be readily deposited as a thin film on the polymer templates using a suitable deposition method, non-limiting examples of such methods include Atomic Layer deposition, Chemical Vapor Deposition, Physical Vapor Deposition, Electroplating, Electroless plating, Electrophoretic Deposition. Other non-limiting examples of materials include metals such as molybdenum, tantalum, titanium, nickel, and tungsten, or ceramics such as Al2O3, HfO2, La2O3, SiO2, TiO2, WN, ZnO, ZrO2, HfC, LaC, WC, ZrC, TaC, or polymers such as poly(p-xylylenes) and functionalized poly(p-xylylenes), e.g. poly(monochloro-p-xylylene), poly(oxymethylene), poly(3, 4-ethylenedioxythiophene), functional poly(acrylates) and methacrylates, e.g. poly(pentafluorophenyl methacrylate), poly(pyrrole-co-thiophene-3-acetic acid), poly(p-phenylene terephthalamide).

In yet another aspect, the present invention is directed to a method for forming the micro-lattice. The method includes several acts, such as forming a micro-lattice template; coating the micro-lattice template with a film of material; and removing the micro-lattice template to leave a cellular material formed of hollow tubes, the cellular material having a relative density in a range of 0.001% to 0.3%.

The micro-lattice template is formed by exposing a photomonomer to a collimated UV light through a patterned mask. The micro-lattice template is an interconnected three-dimensional open cellular photopolymer lattice.

In another aspect, in coating the micro-lattice template with a film of material, the film of material is a metal, ceramic, or polymer. Additionally, the micro-lattice template is coated using a technique selected from a group consisting of electro-plating, electrophoretic deposition, chemical vapor deposition, physical vapor deposition, atomic layer deposition, solution deposition or sol-gel deposition.

Finally and without implying a limitation, in removing the micro-lattice template, the micro-lattice template is removed via chemical etching, thereby leaving the cellular material formed of hollow tubes.

BRIEF DESCRIPTION OF THE DRAWINGS

The objects, features and advantages of the present invention will be apparent from the following detailed descriptions of the various aspects of the invention in conjunction with reference to the following drawings, where.

DETAILED DESCRIPTION

The present invention relates to a micro-lattice and, more particularly, to an ultra-light micro-lattice and a method for forming the same. The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is only one example of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

Before describing the invention in detail, first a list of cited references is provided. Subsequently, an introduction provides the reader with a general understanding of the present invention. Next, specific details of the present invention are provided to give an understanding of the specific aspects. Finally, the specific details of a fabrication example are provided to illustrate the generation of an ultra-light micro-lattice according to the present invention.

(1) List of Cited Literature References

The following references are cited throughout this application. For clarity and convenience, the references are listed herein as a central resource for the reader. The following references are hereby incorporated by reference as though fully set forth herein. The references are cited in the application by referring to the corresponding literature reference number.

1. Guinness Book of World Records, *Least Dense Solid*, 2003.
2. J. Zou, J. Liu, A. S. Karakoti, A. Kumar, D. Joung, Q. Li, S. I. Khondaker, S. Seal, L. Zhai, Ultralight Multiwalled Carbon Nanotube Aerogel, *ACS Nano* 4 7293-7302 (2010).
3. A. Verdooren, H. M. Chan, w J. L. Grenestedt, M. P. Harmer, and H. S. Caram, Fabrication of Low-Density 3. Ferrous Metallic Foams by Reduction of Chemically Bonded Ceramic Foams, *J. Am. Ceram. Soc.* 89 3101-3106 (2006).
4. B. C. Tappan, M. H. Huynh, M. A. Hiskey, D. E. Chavez, E. P. Luther, J. T. Mang, S. F. Son, Ultralow-Density Nanostructured Metal Foams: Combustion Synthesis, Morphology, and Composition, J. Am. Chem. Soc. 128 6589-6594 (2006).
5. M. Chanda, S. K. Roy, *Plastics Technology Handbook* (CRC Press, Boca Raton, Fla., 2007).
6. BASF Corp., Materials Safety Data Sheet for Basotect V3012 (2007)
7. L. J. Gibson, M. F. Ashby, *Cellular Solids: Structure and Properties* (Cambridge Univ. Press, Cambridge, UK, 1997).
8. Hexcel Corp., HexWeb™ *Honeycomb Attributes and Properties,* (Datasheect, 1999).
9. V. S. Deshpande, M. F. Ashby, N. A. Fleck, Foam topology bending versus stretching dominated architectures, *Acta Materialia.* 49 1035-1040 (2001).
10. R. S. Lakes, Materials with structural hierarchy. *Nature* 361 511-515 (1993).
11. A. J. Jacobsen, W. B. Carter, S. Nutt, Compression behavior of micro-scale truss structures formed from self-propagating polymer waveguides. *Acta Materialia* 55 6724-6733 (2007).
12. A. J. Jacobsen, W. B. Carter, S. Nutt, Micro-scale Truss Structures formed from Self-Propagating Photopolymer Waveguides. *Advanced Materials* 19 3892-3896 (2007).
13. A. J. Jacobsen, W. B. Carter, S. Nutt, Shear behavior of polymer micro-scale truss structures formed from self-propagating polymer waveguides. *Acta Materialia* 56 2540-2548 (2008).
14. S. H. Park, D. N. Lee, A study on the microstructure and phase transformation of electroless nickel deposits. *Journal of Materials Science* 23 1643-1654 (1988).
15. J. Lian, L. Valdevit, T. A. Schaedler, A. J. Jacobsen, W. Barvosa-Carter, J. R. Greer, Catastrophic vs. gradual collapse of thin-walled nanocrystalline Ni cylinders as building blocks of micro-lattice structures, Nano Letters 11 p. 4118 (2011).
16. S. Y. Chang, Y. S. Lee, H. L. Hsiao, T. K. Chang, Mechanical properties and deformation behavior of amorphous nickel-phosphorous films measured by nanoindentation test. *Metall Mater Trans A* 37A 2939-2945 (2006).
17. L. G. Brazier, On the Flexure of Thin Cylindrical Shells and Other "Thin" Sections, Proceedings of the Royal Society of London. Series A, 116, No. 773 (1927), pp. 104-114.
18. N. J. Mills, Finite Element Models for the viscoelasticity of open-cell polyurethane foam. *Cellular Polymers* 5 293-316 (2006).
19. A. Cao, P. L. Dickrell, W. G. Sawyer, M. N. Ghasemi-Nejhad, P. M. Ajayan, Super-Compressible Foamlike Carbon Nanotube Films. *Science* 310 1307-1310(2005).
20. J. R. Trelewicz, C. A. Schuh, The Hall-Petch breakdown in nanocrystalline metals: A crossover to glass-like deformation. *Acta Materialia* 55 5948-5958 (2007).
21. W. C. Young, R. G. Budynas, *Roark's Formulas for Stress and Strain* (McGraw-Hill, New York ed. 7 2002) p. 735.
22. J. E. Butler, A. V. Sumant, The CVD of Nanodiamond Materials. *Chem. Vap. Deposition* 14 145-160 (2008).
23. G. F. Smits, Effect of Cellsize Reduction on Polyurethane Foam Physical Properties Reduction. *Journal of Building Physics* 17 309-329 (1994).
24. Mecklenburg et al., Aerographite: Ultra Lightweight, Flexible Nanowall, Carbon Microtube Material with Outstanding Mechanical Performance, Advanced Materials (2012).
25. Schaedler, T. A., Jacobsen, A. J., Torrents, A., Sorensen, A. E., Lian, J., Greer, J. R., Valdevit, L., Carter, W. B., (November, 2011), Ultralight Metallic Microlattices. Science 334, 962-965.

(2) Introduction

The present invention is directed to an ultra-light metallic cellular material that can recover from large deformation. The material is formed of a micro-lattice of hollow tubes with ultra-thin walls (0.1-1 micron). This structure allows for relative densities of 0.01%-0.1% corresponding to 0.9-9 mg/cc for nickel, with a recoverable deformation exceeding 50%, both of which are novel and have not been achieved heretofore.

This invention enables metallic materials that are lighter than any other previously known material. Aerographite currently holds the record for lowest density material at 0.2 mg/cc and metallic foams have held the record for lowest density metallic material at 10 mg/cc. With this invention, nickel cellular materials have been achieved with a density of 0.9 mg/cc. It should be noted that the approach of the present invention can be used to generate materials with even lower densities, as described below.

Additionally, the present invention allows for the generation of metallic materials that can withstand and recover from deformations up to and exceeding 50%. This is an improvement over conventional metallic materials, which will deform plastically when global strains exceed ~1% and will not recover from such a deformation.

The material of the present invention can be applied to a wide range of applications, such as lightweight, multifunctional paneling for aircraft, automobiles, and other vehicles. For example, the reversible deformation property is applicable to multi-cycle energy absorption, such as impact protection of vehicles. In such a mode, the ultra-lightweight aspect would allow for its application without added weight, while still filling space and allowing for a recoverable deformation.

(3) Specific Details

Figure 1:
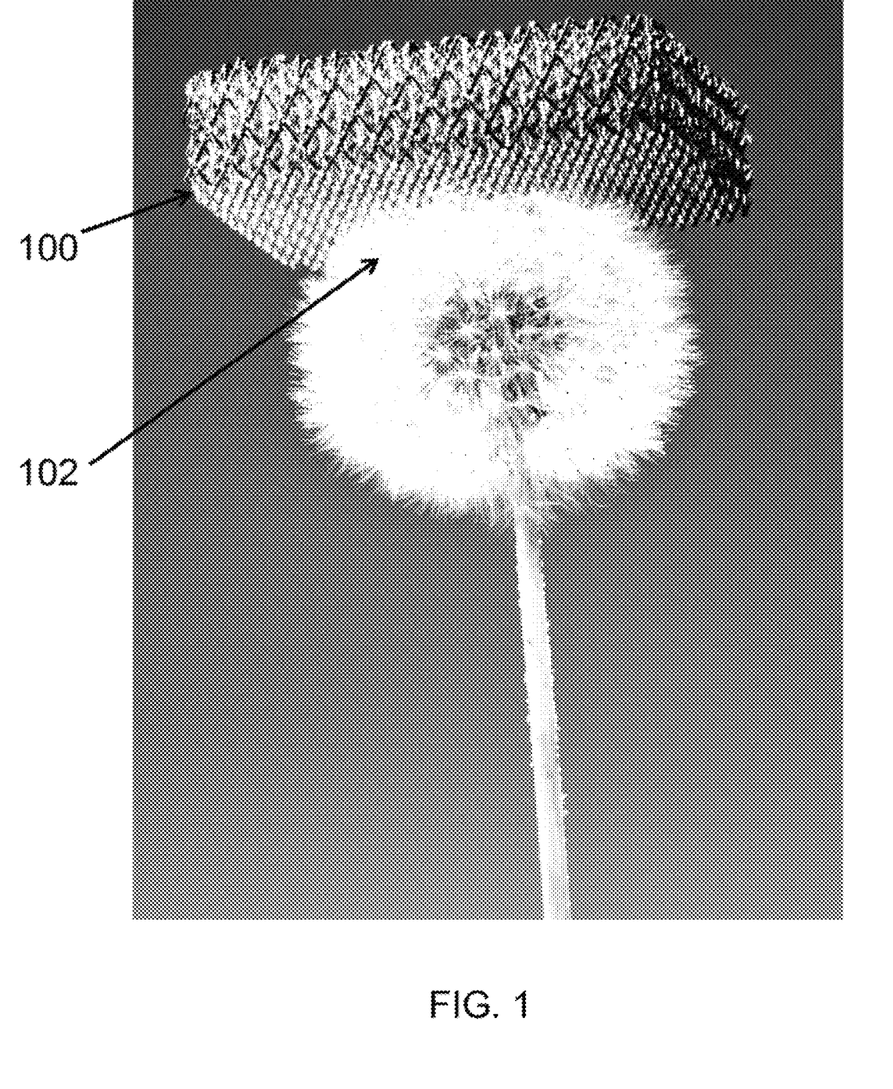
FIG. 1 is an illustration of an ultra-light micro-lattice according to the present invention.

As noted above and as shown in FIG. 1, the present invention is directed to an ultra-light micro-lattice 100 and a method for forming the same. To illustrate the ultra-light nature of the present invention, FIG. 1 is an illustration of the micro-lattice 100 resting atop the petals of a dandelion flower 102. As can be appreciated by one skilled in the art, the micro-lattice 100 is incredibly light, so much so that it is able to rest atop the dandelion flower 102 without crushing its petals. The ultra-light configuration of the micro-lattice 100 is provided due its incredibly low-density design.

To explore the low-density design space that lattice structures offer, a metallic micro-lattice was fabricated according to the present invention with a periodic architecture of hollow tubes that connect at nodes, forming an octahedral unit cell (as shown in FIG. 1). The architecture and the fabrication process provided for a wall thickness of the hollow tubes as thin as 100 nm, resulting in a cellular material with a density of 0.9 mg/cc. The density is calculated using the weight of the solid structures, but not including the weight of the air in the pores, adhering to standard practice for cellular materials. The density of air at ambient conditions, 1.2 mg/cc, would need to be added to express the density of the solid-air composite. In this case, the present invention provides for an ultra-light cellular material having a relative density in a range of 0.001% to 0.3%. The relative density is the ratio of the density (mass of a unit volume) of a substance or object to the density of a given reference material, in this case the constituent material which comprises the micro-lattice (such as the hollow tubes).

Figure 2:
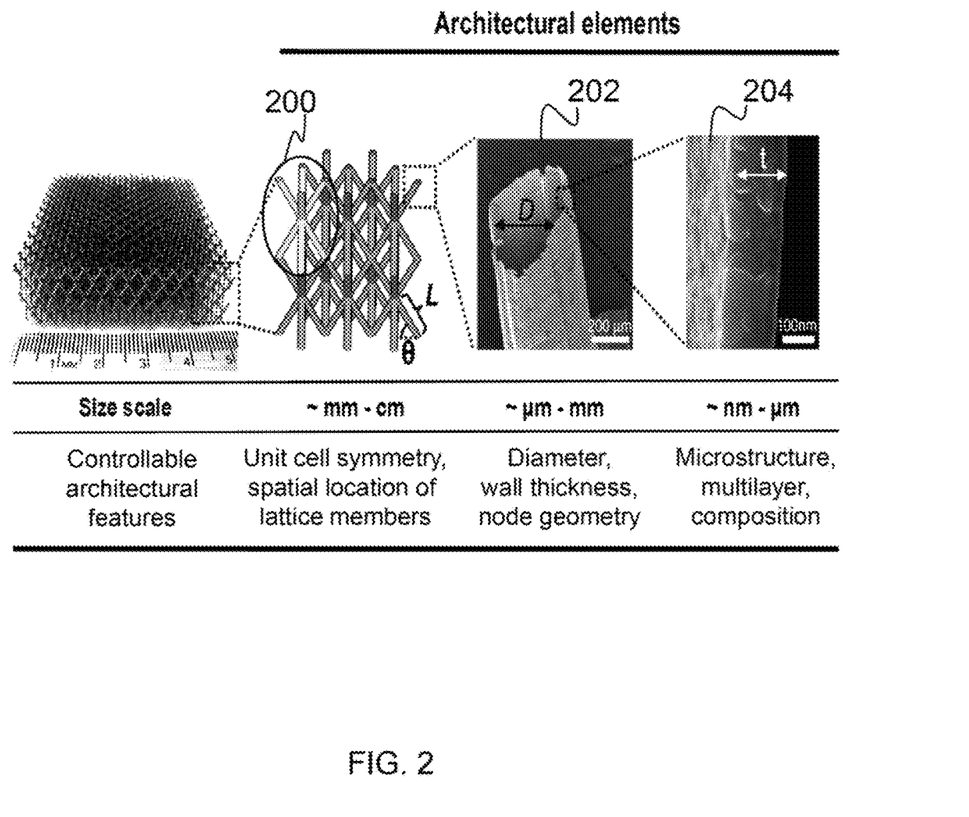
FIG. 2 is an illustration depicting the size scale and controllable architectural features of a micro-lattice according to the present invention.

FIG. 2 illustrates how the micro-lattice architecture can be distilled into three levels of hierarchy at three distinct length scales: unit cell (~mm-cm) 200, hollow tube lattice member (~µm-mm) 202 (i.e., hollow tubes or struts) and hollow tube wall (~nm-µm) 204. Each architectural element can be controlled independently providing exceptional control over the design and properties of the resulting micro-lattice.

With the process of the present invention (described below), unit cell size and topology, hollow tube diameter and wall thickness can be altered independently; when combined with conformal thin-film coating methods, micro-lattice structures with a wide range of constituent compositions and micro-structures become available. The architecture determines the relative density of the lattice, and the film material then dictates the absolute density. The extraordinary control over architecture facilitates de-coupling historically linked properties—like density and stiffness—by allowing independent tailoring of specific properties. For example the compressive modulus of these micro-lattices can be altered by modifying the inclination angle without changing the density significantly (See Literature Reference No. 11). The method to design the micro-lattice architecture at multiple scales from nm to cm allows significantly more control than typical methods for forming ultra-lightweight materials, especially foams and aerogels, where nominally random processes govern porosity formation.

Figure 3:
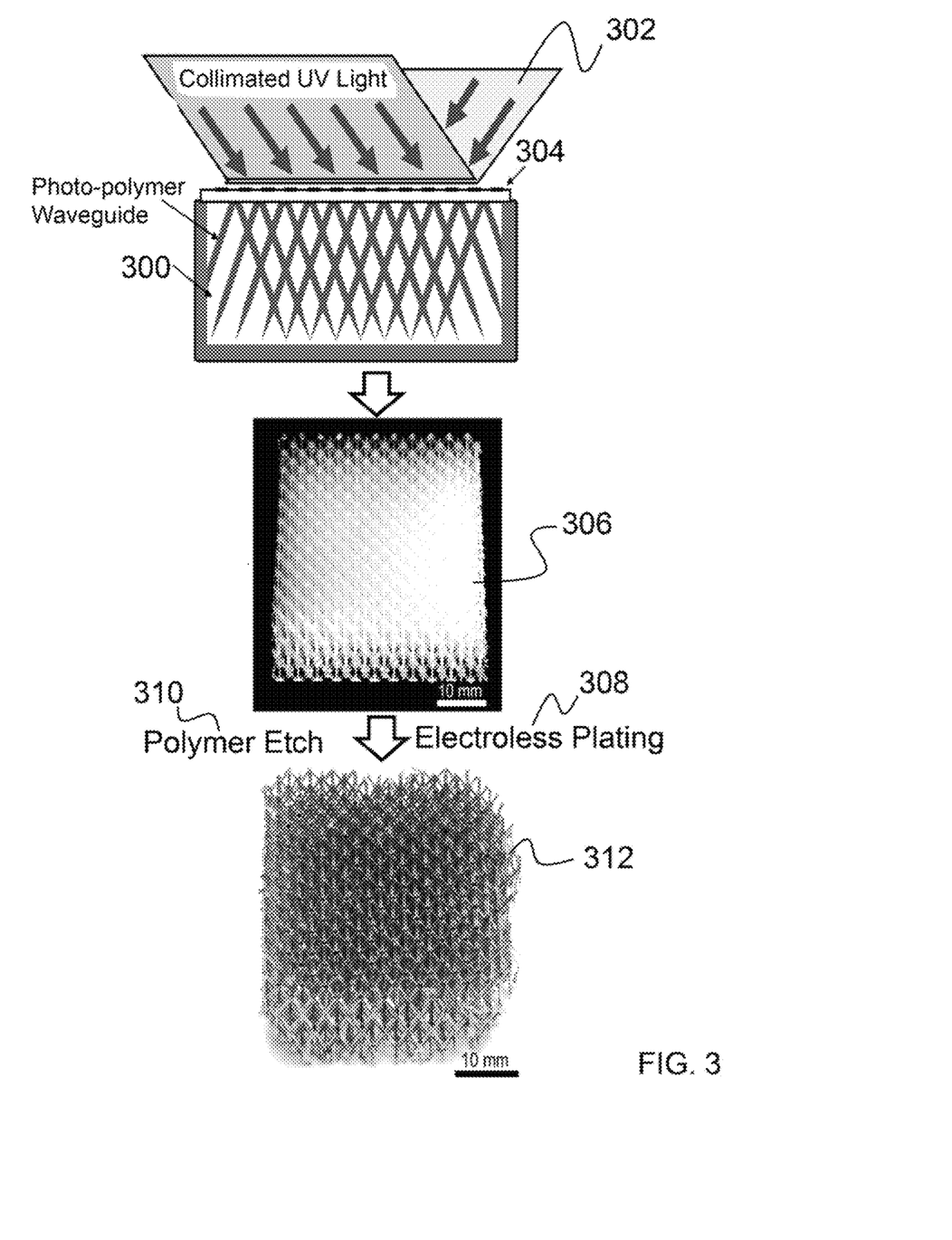
FIG. 3 is an illustration depicting a method for forming an ultra-light micro-lattice according to the present invention.

As shown in FIG. 3, the micro-lattice templates were fabricated using a self-propagating photopolymer waveguide technique reported previously (See Literature Reference No. 12), whereby a suitable liquid photomonomer 300 is exposed to collimated UV light 302 through a patterned mask 304, producing an interconnected three-dimensional photopolymer lattice 306. A non-limiting example of a suitable liquid photomonomer 300 is a thiol-ene resin.

With this method, a wide array of different architectures with unit cells in the 0.1 to >10 mm range can be made by altering the mask 304 pattern and the angle of the incident light (See Literature Reference No. 13). As a non-limiting example, architectures can be generated with 1-4 mm lattice member length L, 100-500 µm lattice member diameter D, 100-500 nm wall thickness t, and 60° inclination angle θ, similar to the micro-lattices depicted in FIG. 2.

It should be noted that the polymer lattice 306 is an open cellular template. After the polymer lattice 306 is generated, films (e.g., conformal nickel-phosphorous thin films) were deposited on the polymer lattices 306 by electroless plating 308 and the polymer was subsequently etched out 310 (via chemical etching or any other suitable etching technique that is gentle enough not to destroy the micro-lattice). The etchant has to be selective with respect to the template and the coating material, i.e., the etching rate of the template needs to be substantially faster than that of the coating. For nickel coatings on thiol-ene templates, sodium hydroxide solution is the preferred etchant, for other material combinations, organic solvents, plasma etching, thermal pyrolysis or other etchants are favored. Freeze drying is used for fragile micro-lattices that are deformed by capillary forces on removal from solution.

The auto-catalytic electroless nickel plating reaction enables deposition of thin films with controlled thickness on complex shapes and inside pores without noticeable mass transport limitations. By controlling reaction time, a wall thickness of 100 nm can be achieved while maintaining a uniform conformal coating. The resulting ultra-light micro-lattice 312 essentially translates the deposited nano-scale thin film in three dimensions to form a macroscopic material where the base structural elements are hollow tubes (as shown in FIG. 2). It should be noted that any suitable material can be deposited on the polymer lattice 306, non-limiting examples of which include nickel, zinc, chrome, tin, copper, gold silver, platinum, rhodium, aluminum, a ceramic, including, diamond, diamond like carbon, alumina, zirconia, tin oxide, zinc oxide, silicon carbide, silicon nitride, titanium nitride, tantalum nitride, tungsten nitride, a polymer including parylene or combinations or alloys thereof, including multi-layers of different materials.

Transmission electron microscopy (TEM) revealed that the as-deposited electroless nickel thin films are nano-crystalline, with ~7 nm grain sizes consistent with literature reports (See Literature Reference No. 14). Energy-dispersive X-ray spectroscopy confirmed that the composition of the deposit is 7% phosphorous and 93% nickel by weight. Since the films were not annealed after deposition, they remained as a supersaturated solid solution of phosphorous in crystalline face-centered cubic (fcc) nickel lattice with no $Ni_3P$ precipitates present (See Literature Reference No. 14). The 7 nm grain size renders electroless nickel thin films harder and more brittle than typical nano- and micro-crystalline nickel. A hardness of 6 GPa and modulus of 210 GPa were measured by nano-indentation and hollow tube compressions (See Literature Reference Nos. 15 and 16).

Micro-lattices with these extreme low densities exhibit unique mechanical behavior. Compression experiments on micro-lattices show recovery from strains exceeding 50%.

Figure 4A:
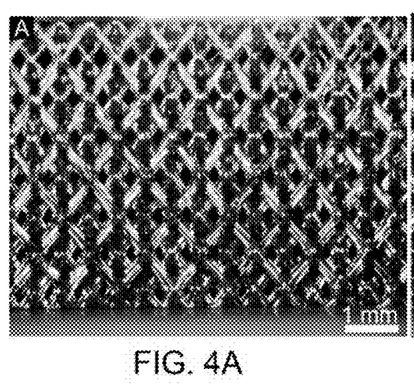
FIG. 4A is an illustration of a micro-lattice sample prior to compression.
Figure 4B:
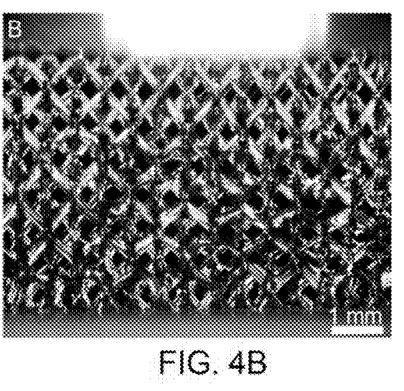
FIG. 4B is an illustration of the micro-lattice sample after a first compression.
Figure 4C:
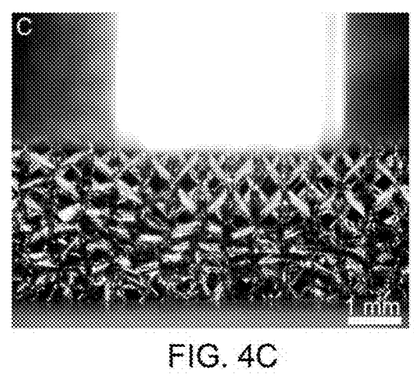
FIG. 4C is an illustration of the micro-lattice sample, depicting the sample at 50% compression.
Figure 4D:
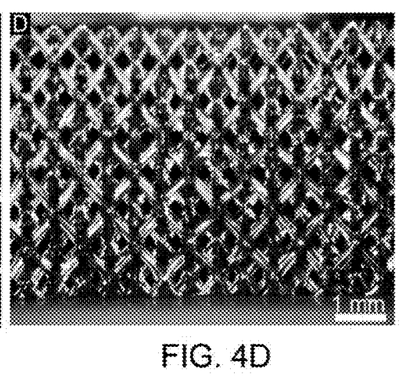
FIG. 4D is an illustration depicting the micro-lattice sample after the compression load is removed, illustrating that the ultra-light micro-lattice recovers approximately 98.6% of its original height and resumes its original shape.
Figure 4E:
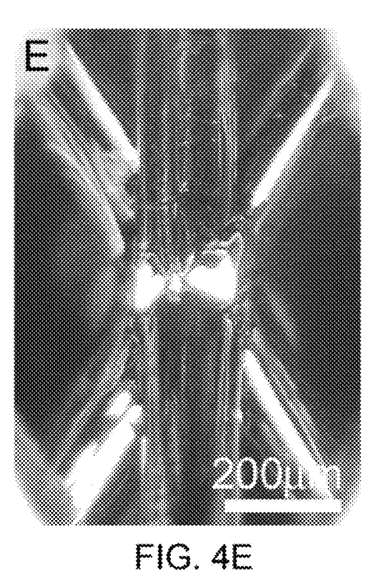
FIG. 4E is an optical image of a unit cell of the micro-lattice, in an unloaded or uncompressed condition.
Figure 4F:
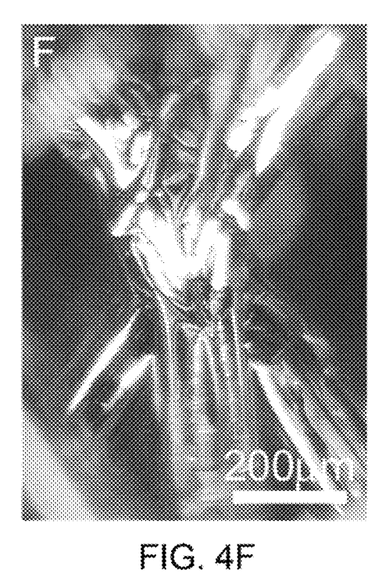
FIG. 4F is an optical image of the unit cell, depicting the unit cell as accommodating compressive strain by buckling at its nodes.
Figure 4G:
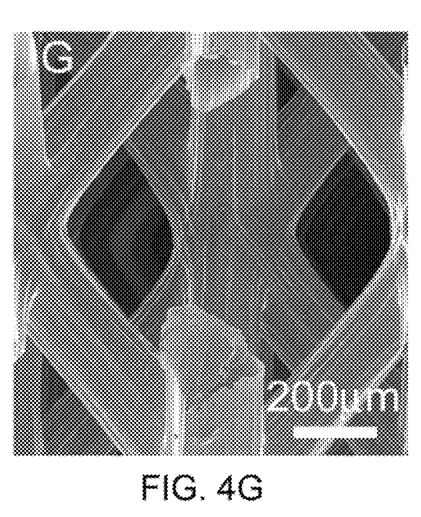
FIG. 4G is a scanning electron microscopy (SEM) image of a node before testing.
Figure 4H:
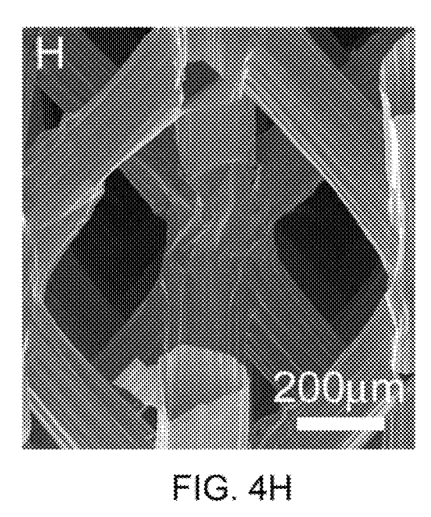
FIG. 4H is an SEM image of the node after six compression cycles at 50% strain.
Figure 5A:
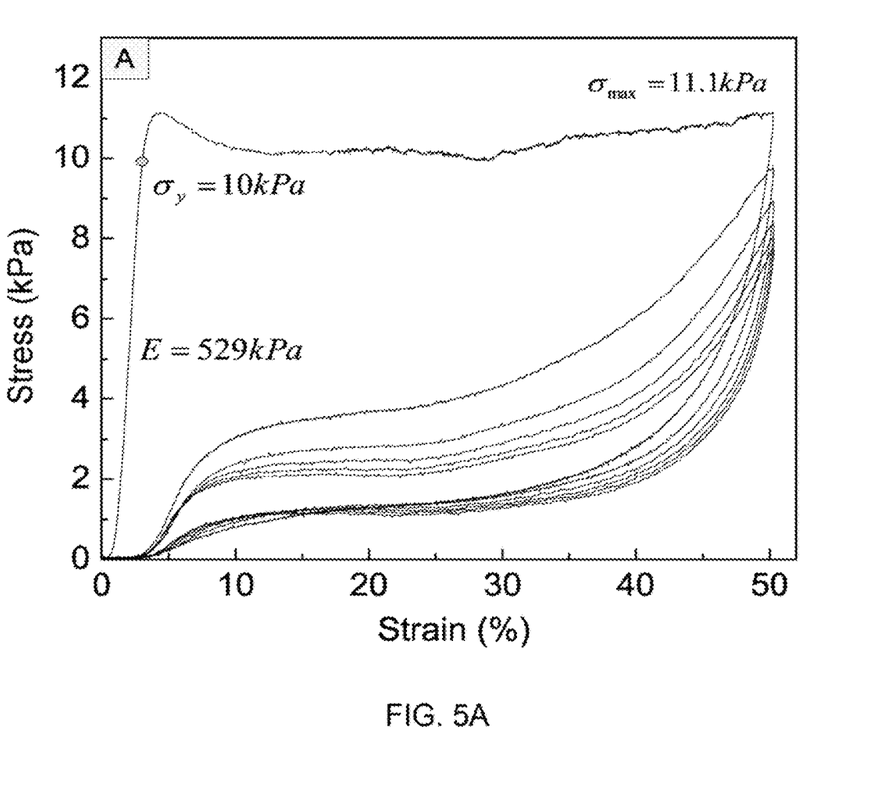
FIG. 5A is a graph illustrating a stress-strain curve measured at a prescribed displacement rate of 10 μm/sec.

FIGS. 4A through 4D provide images of a micro-lattice sample 400 with 14 mg/cc (L: 1050 µm, D: 150 µm, t: 500 nm) during compression testing while FIG. 5A conveys the corresponding stress-strain curve measured at a prescribed displacement rate of 10 m/sec. In these experiments, the sample was not attached to face sheets or the compression platens at the bottom or the top. FIG. 4A depicts the micro-lattice sample 400 prior to compression. As shown in FIG. 4B, upon first compression, the lattice exhibits a compressive modulus of 529 kPa, with deviations from linear elastic behavior starting at a stress of 10 kPa. The stress decreases slightly after the peak associated with buckling and node fracture events, and a broad plateau is subsequently formed in the stress-strain curve as buckling and localized node fracture events spread through the lattice. FIG. 4C shows the micro-lattice at 50% compression. Upon unloading, the stress drops rapidly but does not approach zero until the platen is close to its original position. After removing the load, the micro-lattice recovers to 98.6% of its original height and resumes its original shape (as shown in FIG. 4D). For further illustration, FIGS. 4E through 4H provide images of the micro-lattice sample through its compression and recovery. More specifically, FIG. 4E is an optical image of a unit cell of the micro-lattice, in an unloaded or uncompressed condition. FIG. 4F is an optical image of the unit cell, depicting how the unit cell accommodates compressive strain by buckling at the nodes. FIG. 4G is a scanning electron microscopy (SEM) image of a node before testing, while FIG. 4H is an SEM image of the node after six compression cycles at 50% strain.

Interestingly, the stress-strain behavior corresponding to the 1$^{st}$ cycle is never repeated during subsequent testing. Rather, during a second compression, the peak stress is absent and the 'pseudo-hardening' behavior changes, but the stress level achieved at 50% strain is only 10% lower than that after the first cycle. Consecutive compression cycles exhibit stress-strain curves nearly identical to the second compression.

Figure 5B:
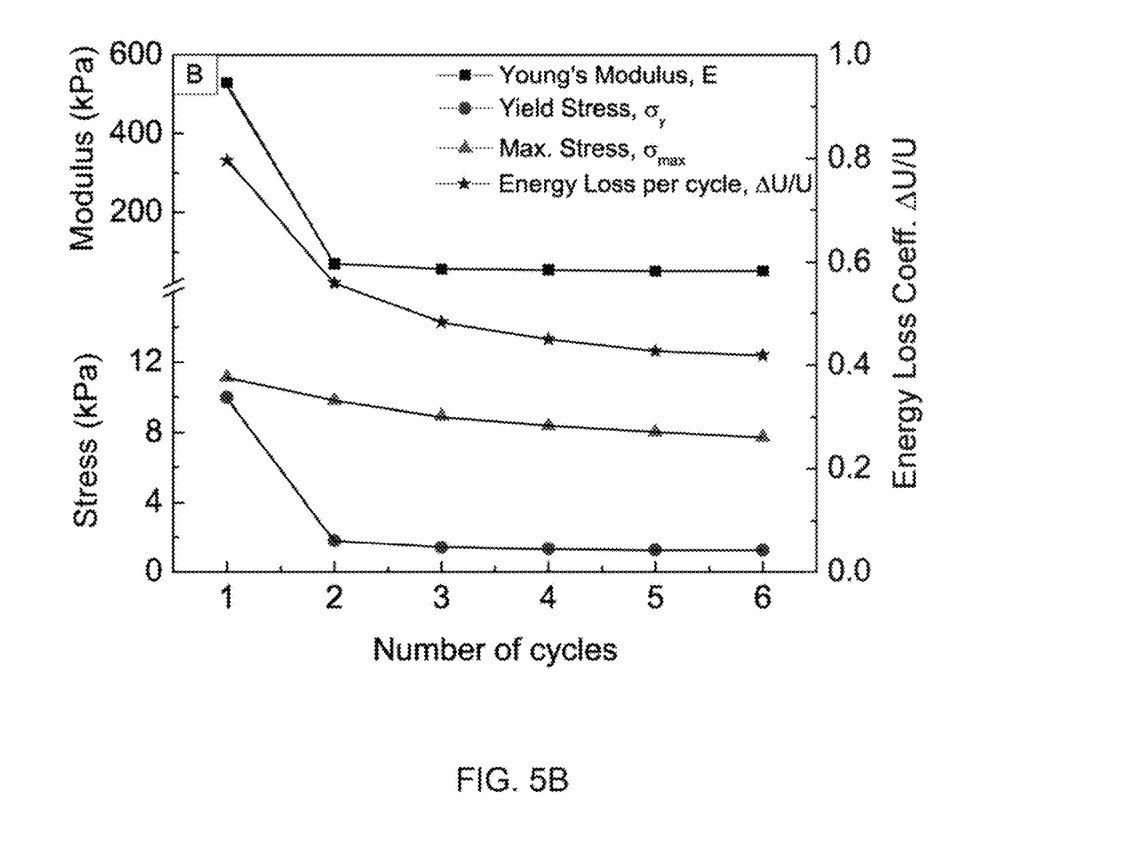
FIG. 5B is a graph of illustrating how stiffness and strength diminish with cycle number.

As shown in FIG. 5B, stiffness and strength diminish with cycle number, but are almost constant after the third cycle (as shown in FIG. 5B). The micro-lattice shows significant hysteresis during compression experiments, allowing a measurement of the energy absorption, which is estimated to be 2.2 mJ for the first cycle. After three cycles a nearly constant energy loss coefficient of ~0.4 is calculated by dividing the absorbed energy by the total energy required for compression (as shown in FIG. 5B).

Figure 5C:
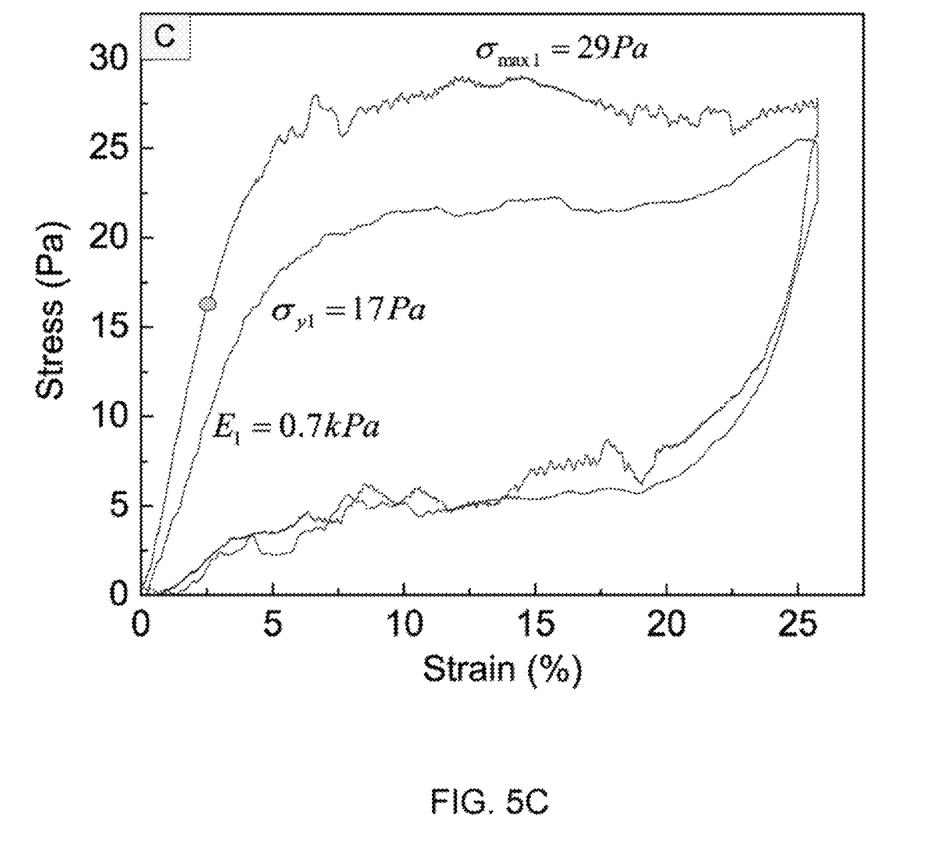
FIG. 5C is a graph illustrating stress-strain curves of the first two compression cycles of a sample with a density of 1 mg/cc and larger unit cells (L: 4 mm, D: 500 μm, t: 120 nm)
Figure 5D:
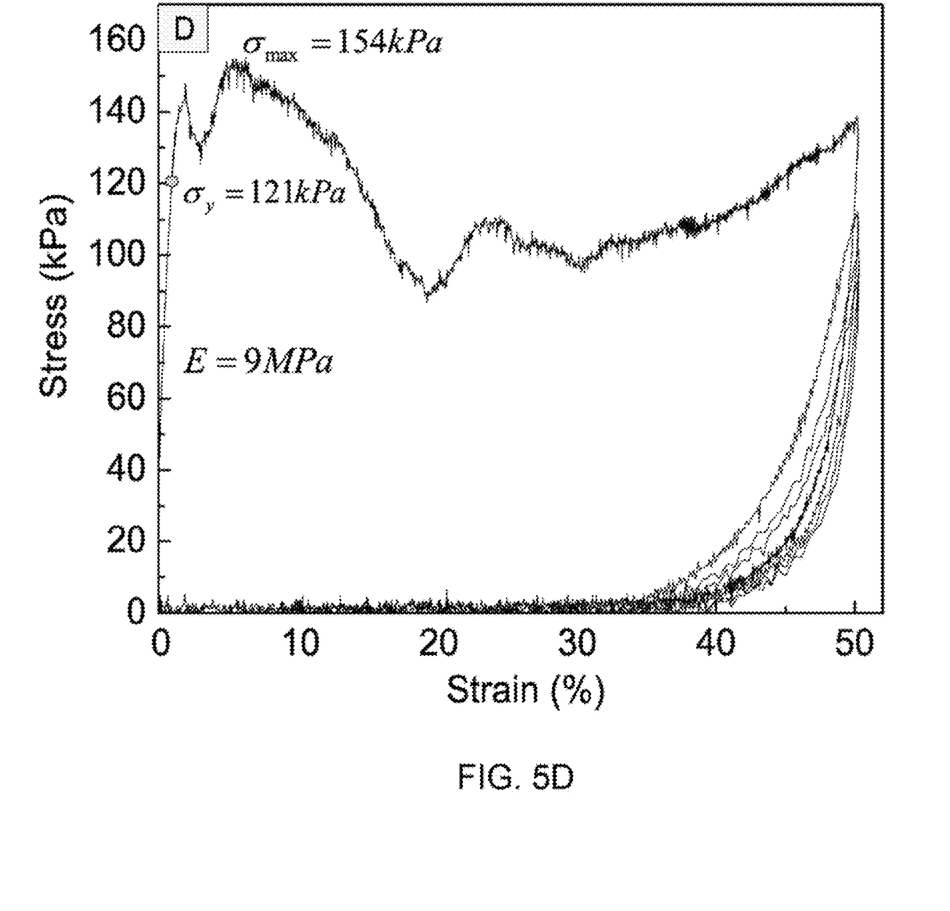
FIG. 5D is a graph illustrating stress-strain curves of the compression of a sample with 43 mg/cc (L: 1050 μm, D: 150 μm, t: 1400 nm)

FIG. 5C shows the stress-strain curves of the first two compression cycles of a sample with a density of 1 mg/cc and larger unit cells (L: 4 mm, D: 500 μm, t: 120 nm) illustrating similar behavior of different micro-lattices in the ultra-low density regime. Increasing the density and wall thickness will eventually lead to compression behavior more typical for metallic cellular materials. FIG. 5D shows the compression of a sample with 43 mg/cc (L: 1050 μm, D: 150 μm, t: 1400 nm): notice that strain recovery upon unloading from 50% strain is essentially absent.

Optical examination of the ultra-light micro-lattices during deformation suggests that deformation initiates by Brazier buckling at the nodes (as shown in FIGS. 4E and 4F) (See Literature Reference No. 17). A closer inspection of the micro-lattices by SEM shows that cracks and wrinkles are introduced primarily at the nodes during 50% compression (as shown in FIGS. 4G and 41H). This damage is responsible for the 1-2% residual strain observed after the first compression cycle, and the drop in the yield strength and modulus during subsequent compression cycles. Once stable relief cracks form at the nodes, the bulk micro-lattice material can undergo large compressive strains without enduring further fracture or plastic deformation in the solid nickel-phosphorous material, thus exhibiting the reversible compressive behavior shown in FIGS. 4A through 5D. While the precise details concerning the deformation mechanism are currently under investigation, it is clear that the extremely small aspect ratio of the hollow tube wall to diameter plays a key role in the nearly full recoverability, by allowing truss members to undergo large rotations about remnant nodal ligaments without accumulation of significant plasticity. Increasing this aspect ratio leads to excessive fracture and loss of the recoverable deformation behavior (as shown in FIG. 5D).

Figure 5E:
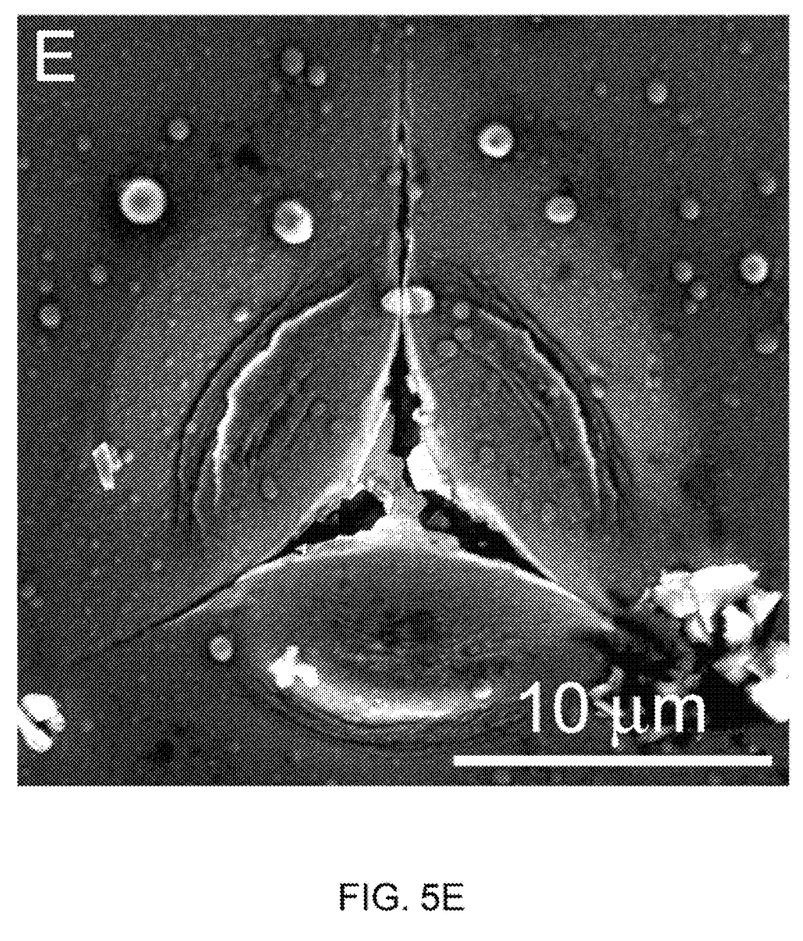
FIG. 5E is an SEM micrograph of post-nanoindentation mark in a 500 nm-thick electroless nickel film, demonstrating brittle behavior.

Although similar stress-strain curves as presented in FIG. 5A are typical for foams of viscoelastic polymer (See Literature Reference No. 18) and carbon nanotube forests (See Literature Reference No. 19), they are unprecedented for metal-based materials. Two energy loss mechanisms could possibly explain the energy dissipation during compression cycles: (1) Structural damping due to snapping events (e.g., kinking, or Brazier buckling of the trusses) and (2) Mechanical or Coulomb friction through members in contact (or a combination of both). This mechanical behavior is especially surprising considering the relatively brittle nature of the constituent material. The electroless nickel thin films are found to be brittle, as evidenced by the formation of cracks near a residual indentation mark (as shown in FIG. 5E) and the rapid collapse upon single hollow truss member compressions (See Literature Reference No. 15). Specifically, FIG. 5E is an SEM micrograph of post-nanoindentation mark in a 500 nm-thick electroless nickel film, demonstrating brittle behavior. This is likely due to the ultra-fine grain sizes of ~7 nm that hinder plastic deformation by dislocation motion (See Literature Reference No. 20).

However, the micro-lattices exhibit completely different bulk properties: the cellular architecture effectively transforms the brittle thin-film property into a ductile and superelastic lattice behavior by enabling sufficient freedom for deformation and tolerance to local strains, such as forming relief cracks that are stable during repeated compression cycles, while still maintaining the structure to remain coherent. Hence, cellular material architecture can fundamentally change the material properties and generate functional ductility and functional superelasticity at the bulk scale.

Although the present invention has demonstrated formation of the lightest known material to date, micro-lattice materials with even lower density could be fabricated by following the same methodology. The density of the synthesized micro-lattices can be approximated by:

$$\rho = \frac{2\pi}{\cos^2\theta \sin\theta}\left(\frac{D}{L}\right)\left(\frac{t}{L}\right)\rho_s \qquad (1)$$

where $\rho_s$ is the density of the constituent material. The wall thickness t reaches a minimum at 100 nm with the current fabrication process because it requires a continuous and robust film that can withstand the mechanical forces associated with removal of the polymer template. Naturally, the density decreases with increasing cell size, or lattice member length L. By increasing L four-fold and keeping L/D roughly constant, the density was decreased by approximately the same factor, suggesting that it is possible to attain further reductions in density with even larger cell sizes. Achievable densities will be limited by the mechanical stability of the micro-lattice structure both during processing and against ambient loading (e.g. gravity, air currents).

To assess the mechanical stability limit, it is assumed that the compressive strength of the lattice scales with the local buckling strength, $\sigma_{lb}$, of the hollow tubes (See Literature Reference No. 21):

$$\sigma_{lb} = \frac{2E_s}{\sqrt{3(1-v_s^2)}}\left(\frac{t}{D}\right) \qquad (2)$$

where $E_s$ is the Young's modulus and $v_s$ the Poisson's ratio of the solid constituent material.

Using the micro-lattice with 1 mg/cc and a strength of 29 Pa in FIG. 5C as a reference, the density of similar micro-lattices with t=100 nm and L/D=8 could be reduced to 0.2 mg/cc by increasing L to 2 cm while maintaining a compressive strength of 3 Pa. The density could be pushed lower with a constituent thin film material with a higher specific stiffness and strength. Diamond may be among the best candidates with its extremely high stiffness and strength and well established vapor deposition routes enabling films with <50 nm thickness (See Literature Reference No. 20). The calculated density of diamond micro-lattices with 50 nm wall thickness and L/D=8 is 0.01 mg/cc, which represents a fivefold reduction in density by switching from nickel to diamond.

As described herein, by designing architecture of hollow-tube micro-lattice materials at three levels of structural hierarchy, unprecedented mechanical properties and low densities can be achieved, redefining how light a material can be. Extending this approach to other materials deposited by e.g. atomic layer deposition (ALD) electrophoretic deposition (EPD) or chemical vapor deposition (CVD) and developing appropriate computational tools for architecture optimization will undoubtedly lead to additional extraordinary cellular materials that further redefine the limits of low-density materials.

(4) Fabrication Example (4.1) Polymer Micro-Lattice Fabrication

Polymer micro-lattice templates were fabricated from an interconnected pattern of self-propagating photopolymer waveguides as described in detail elsewhere (See Literature Reference Nos. 12 and 13). Prior to electroless plating, all samples were thermally post-cured at 120° C. in air for 12 hrs.

(4.2) Hollow Nickel Micro-Lattice Formation

Figure 6:
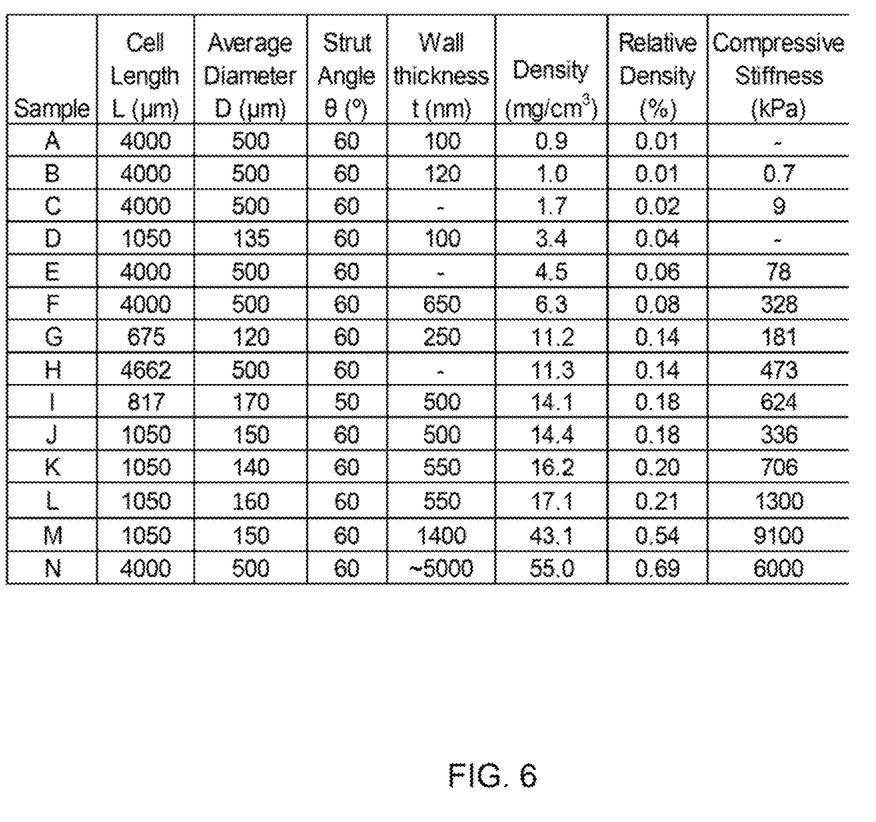
FIG. 6 is a table including a summary of architecture and properties of micro-lattices according to the present invention.

The polymer micro-lattice template samples were then used as direct templates for electroless nickel plating using a commercially available process, such as that provided by OM Group Inc., located at 127 Public Square, 1500 Key Tower, Cleveland, Ohio 44114. To prepare the surface for electroless deposition, the polymer sample were first heat treated at greater than 120 degrees Celsius and then immersed in 1 molar sodium hydroxide solution, then palladium catalyst was deposited by immersion in activator solution containing hydrochloric acid and tin(II) chloride (Fidelity 1018, OM Group Inc.), followed by an etch in accelerator solution containing fluoboric acid (Fidelity 1019, OM Group Inc.). The samples were then immersed in electroless nickel plating solution with nickel sulfite as nickel source, sodium hypophosphite as reducing agent, and sodium malate and acetic acid as complexing agents (9026M, OM Group Inc.). The electroless nickel plating bath was kept at pH 4.9 by addition of ammonium hydroxide and plating was performed at 80° C. Different plating times were chosen to achieve different coating thicknesses (as reported in FIG. 6). A wall thickness t of 500 nm was achieved by electroless nickel plating of approximately 3 minutes. After nickel deposition the top and bottom surface of each sample was sanded to expose the underlying polymer at each node. The polymer was then chemically etched in a base solution (3M NaOH at 60° C.) for 24 hours, creating the hollow tube nickel micro-lattice samples in FIG. 2. Samples with wall thickness below ~150 nm could not be removed from the aqueous NaOH solution directly because the capillary forces deformed the lattice. In these cases, the samples were freeze dried after exchanging the NaOH solution to deionized water and then to t-butanol.

It should be noted that the conditions during the chemical etch have to be carefully adjusted to provide enough agitation to dissolve the polymer in the hollow tubes but limit the forces acting on the micro-lattice to avoid fracture. Successful etching conditions were achieved by inserting shields around the micro-lattice to protect it from the solution flow. Below a certain wall thickness, depending on the architecture, the micro-lattice is too fragile to remove them from the liquid. In this case freeze drying is employed to remove the liquid. As noted above, a solvent exchange was performed to exchange the aqueous NaOH solution with t-Butanol and subsequently the t-Butanol containing the micro-lattice is frozen. T-Butanol exhibits a much lower volume change on freezing than water resulting in less damage to the micro-lattice. A vacuum is then applied to sublimate the t-butanol leaving a dry micro-lattice of the present invention behind.

What is claimed is:

1. A method for forming a micro-lattice, comprising acts of:
   forming a micro-lattice template;
   coating the micro-lattice template with a film of material;
   removing the micro-lattice template to leave a micro-lattice formed of two or more layers of stacked truss, each layer of truss formed of hollow tubes, the micro-lattice having a relative density in a range of 0.001% to 0.3%.

2. The method as set forth in claim 1, wherein the micro-lattice template is formed by exposing a photomonomer to a collimated UV light through a patterned mask.

3. The method as set forth in claim 2, wherein the micro-lattice template is an interconnected three-dimensional open cellular photopolymer lattice.

4. The method as set forth in claim 3, wherein in coating the micro-lattice template with a film of material, the film of material is a metal, ceramic, or polymer.

5. The method as set forth in claim 4, wherein in removing the micro-lattice template, the micro-lattice template is removed via chemical etching.

6. The method as set forth in claim 5, wherein in coating the micro-lattice template with a film of material, the micro-lattice template is coated using a technique selected from a group consisting of electro-plating, electrophoretic deposition, chemical vapor deposition, physical vapor deposition, atomic layer deposition, solution deposition or sol-gel deposition.

7. The method as set forth in claim 1, wherein the micro-lattice template is an interconnected three-dimensional open cellular photopolymer lattice.

8. The method as set forth in claim 1, wherein in coating the micro-lattice template with a film of material, the film of material is a metal, ceramic, or polymer.

9. The method as set forth in claim 1, wherein the relative density is the density of the micro-lattice divided by the density of the constituent material of the micro-lattice.

10. The method as set forth in claim 1, wherein the hollow tubes are formed by tube walls having a wall thickness between 0.01 and 2 microns.

11. The method as set forth in claim 1, wherein the hollow tubes have a diameter such that the diameter is between 10 and 1000 microns.

* * * * *